(12) United States Patent
Sankavaram et al.

(10) Patent No.: US 11,762,028 B2
(45) Date of Patent: Sep. 19, 2023

(54) RESISTANCE ESTIMATION OF HIGH VOLTAGE BATTERY PACKS DURING VEHICLE CHARGING OPERATION

(71) Applicant: GM GLOBAL TECHNOLOGY OPERATIONS LLC, Detroit, MI (US)

(72) Inventors: Chaitanya Sankavaram, Rochester Hills, MI (US); Garrett Michael Seeman, Troy, MI (US); Zining Zhang, Novi, MI (US); Calvin Wang, Union City, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/669,486

(22) Filed: Feb. 11, 2022

(65) Prior Publication Data

US 2023/0258730 A1    Aug. 17, 2023

(51) Int. Cl.
*G01R 31/389* (2019.01)
*G01R 31/396* (2019.01)
*B60L 58/12* (2019.01)
*G01R 31/374* (2019.01)
*G01R 31/3842* (2019.01)

(52) U.S. Cl.
CPC ............ *G01R 31/389* (2019.01); *B60L 58/12* (2019.02); *G01R 31/374* (2019.01); *G01R 31/3842* (2019.01); *G01R 31/396* (2019.01)

(58) Field of Classification Search
None
See application file for complete search history.

(56) References Cited

U.S. PATENT DOCUMENTS

2013/0200902 A1* 8/2013 Kurimoto ............ G01R 31/385
                                                           429/158
2013/0325379 A1* 12/2013 Nakamura ......... G01R 31/3835
                                                           702/63

\* cited by examiner

*Primary Examiner* — Jas A Sanghera

(57) ABSTRACT

A current measuring circuit measures a charging current of a battery comprising a plurality of cell groups while the battery is being charged using one of a plurality of charging systems. A voltage measuring circuit measures voltages of the cell groups. A controller defines a plurality operating regions in a charging current profile of the battery during a charging cycle, filters the charging current and the voltages measured in the operating regions, calculates internal resistances of the cell groups in the operating regions based on the filtered current and voltages, generates at least one of statistical values and distance metrics based on the internal resistances of the cell groups, and determines whether one or more of the cell groups is faulty based on the at least one of the statistical values and the distance metrics irrespective of the plurality of charging systems used to charge the battery.

20 Claims, 15 Drawing Sheets

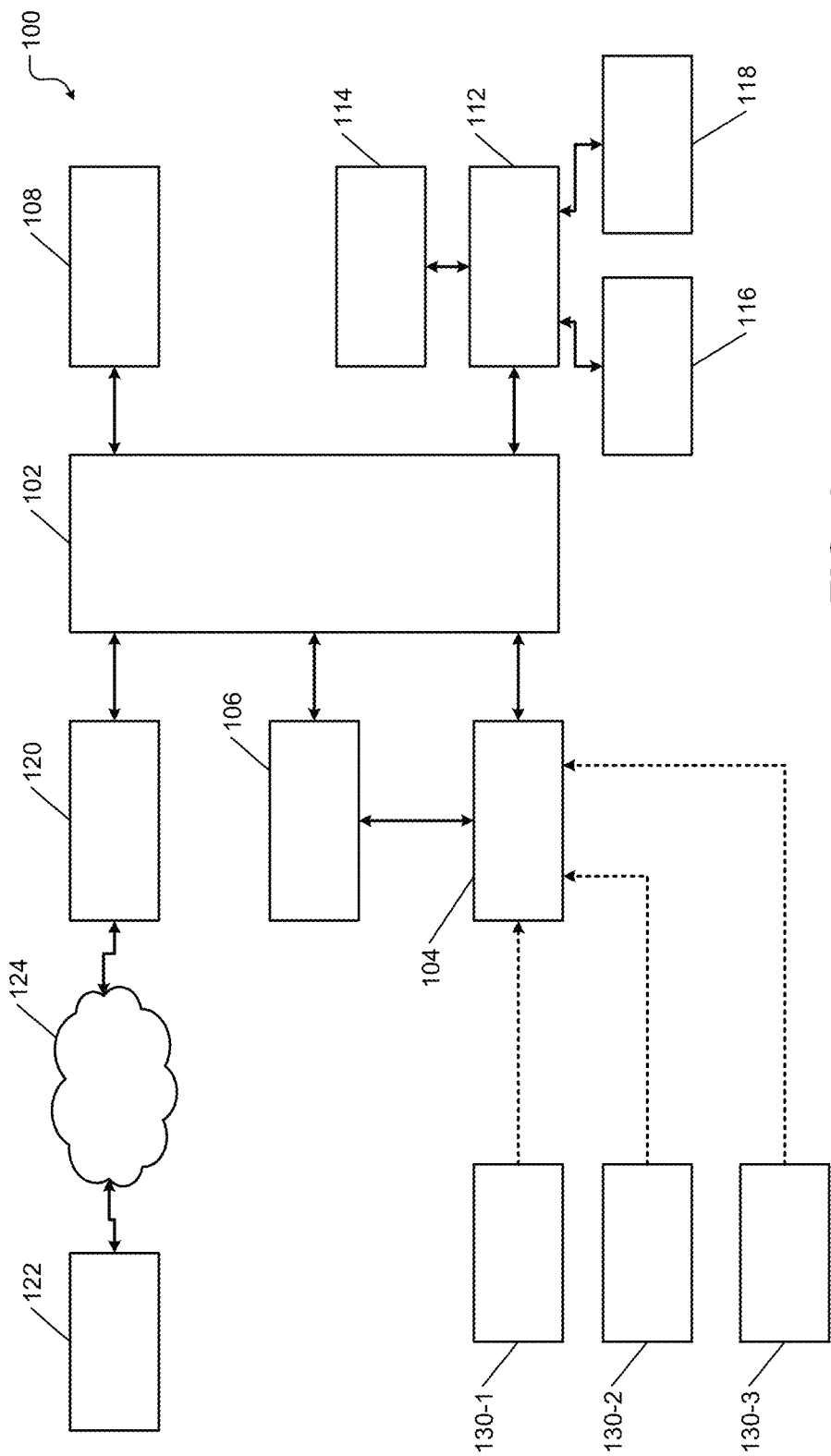

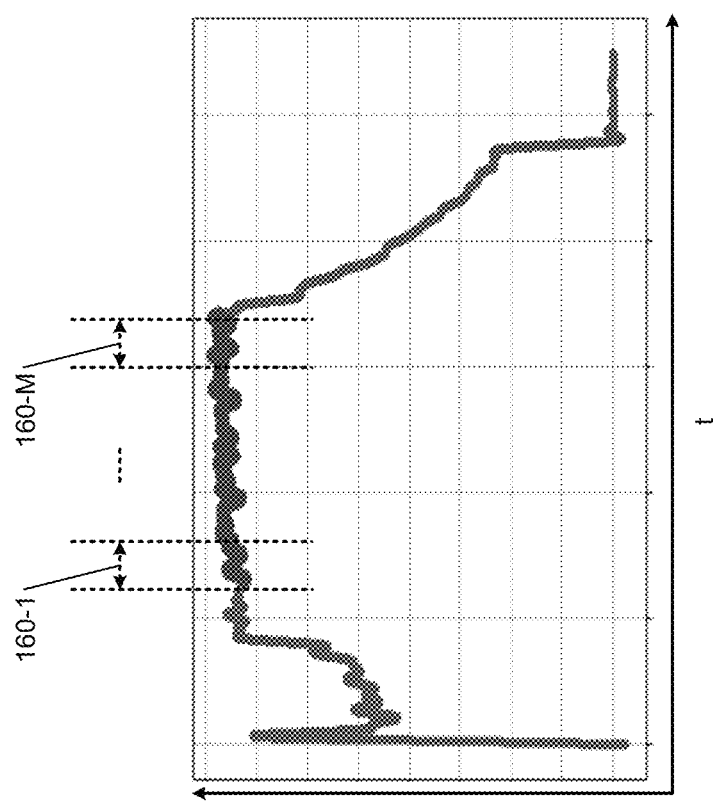

RESISTANCE ESTIMATION OF HIGH VOLTAGE BATTERY PACKS DURING VEHICLE CHARGING OPERATION

CROSS-REFERENCE TO RELATED APPLICATIONS

This application is related to U.S. patent application Ser. No. 17/516,223 entitled RESISTANCE ESTIMATION OF HIGH VOLTAGE BATTERY PACKS DURING VEHICLE DRIVING OPERATION and U.S. patent application Ser. No. 17/516,279 entitled "HEALTH MONITORING METHODS FOR EARLY FAULT DETECTION IN HIGH VOLTAGE BATTERY PACKS USED IN ELECTRIC VEHICLES" filed on Nov. 1, 2021. The entire disclosures of the applications referenced above are incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to electric vehicles and more particularly to resistance estimation of high voltage battery packs during vehicle charging operation.

Use of electric vehicles is proliferating. The electric vehicles are powered by batteries. Performance of the batteries tends to degrade over time. The batteries may also develop problems during use. For example, one or more cells in a battery pack may develop problems and/or degrade faster than other cells in the battery pack. An internal resistance of a battery changes as the battery ages. For example, the internal resistance increases due to changes in temperature, state of charge, and current drawn from the battery. The internal resistance also changes if one or more cells in a battery pack develop problems. The changes in the internal resistance of the battery can indicate degradation of battery performance over time and can be used to detect problems that may develop in the battery during use.

SUMMARY

A system for monitoring a battery of a vehicle comprises a current measuring circuit, a voltage measuring circuit, and a controller in communication with current and voltage measuring circuits. The current measuring circuit is configured to measure a charging current of the battery comprising a plurality of cell groups connected to each other while the battery is being charged using one of a plurality of charging systems. The voltage measuring circuit is configured to measure voltages of the cell groups while the battery is being charged using the one of the plurality of charging systems. The controller is configured to define a plurality operating regions in a charging current profile of the battery during a charging cycle of the vehicle while the battery is being charged using the one of the plurality of charging systems. The controller is configured to filter the charging current and the voltages measured in the operating regions and to calculate internal resistances of the cell groups in the operating regions based on the filtered current and voltages. The controller is configured to generate at least one of statistical values and distance metrics based on the internal resistances of the cell groups. The distance metrics are generated by dividing differences between the internal resistances and mean values of the internal resistances by a standard deviation of the internal resistances. The controller is configured to determine whether one or more of the cell groups is faulty based on the at least one of the statistical values and the distance metrics irrespective of the plurality of charging systems used to charge the battery.

In another feature, the controller is configured to determine whether the one or more of the cell groups is faulty based on at least one of (i) a highest value of differences between maximum and minimum values of one or more of the statistical values across the cell groups and (ii) a highest value of the distance metrics across the cell groups.

In another feature, the controller is configured to determine whether the one or more of the cell groups is faulty based on the at least one of the statistical values and the distance metrics computed for each of the plurality of charging systems used to charge the battery.

In another feature, the controller is configured to define one of the operating regions based on the charging current, temperature, and state of charge of the battery when the charging current is stable for a predetermined time period in the one of the operating regions.

In other features, the controller is configured to define the operating regions based on predetermined ranges of the charging current, temperature, and state of charge of the battery; and to determine whether the one or more of the cell groups is faulty regardless of changes in temperature and state of charge of the battery.

In other features, the controller is configured to define a plurality of bands within one of the operating regions based on a predetermined range of the charging current and a plurality of predetermined ranges of temperature and state of charge of the battery. The controller is configured to calculate the internal resistances of the cell groups in the bands based on the filtered current and the voltages. The controller is configured to generate individual statistical values for the bands based on the internal resistances of the cell groups in the bands. The controller is configured to determine differences between maximum and minimum values of one or more of the individual statistical values. The controller is configured to select internal resistance data of the cell groups from one of the bands corresponding to a highest value of the differences between maximum and minimum values. The controller is configured to diagnose the health of the battery based on the selected internal resistance data.

In other features, the controller is configured to select internal resistance data of the cell groups from one of the operating regions corresponding to a highest value of differences between maximum and minimum values of one or more of the statistical values across the cell groups. The controller is configured to store information including at least one of the selected internal resistance data and a highest value of the distance metrics across the cell groups for diagnosing the one or more of the cell groups. The controller is configured to send the stored information to a server for prognostics and determining a trend in a health of the battery. The controller is configured to provide a message regarding the health of the battery based on the stored information.

In other features, the controller is configured to, for each of the plurality of charging systems used to charge the battery, select internal resistance data of the cell groups from one of the operating regions corresponding to a highest value of differences between maximum and minimum values of one or more of the statistical values across the cell groups. The controller is configured to store the at least one of the selected internal resistance data and a highest value of the distance metrics. The controller is configured to compare the at least one of the selected internal resistance data and the highest value of the distance metrics to respective thresholds calibrated for the plurality of charging systems. The controller is configured to determine whether one or more of the cell groups are failing across the plurality of charging systems.

In other features, the system further comprises a server configured to receive the at least one of the selected internal resistance data and a highest value of the distance metrics from a plurality of vehicles, analyze a distribution of the at least one of the selected internal resistance data and the highest value of the distance metrics, and calibrate the thresholds based on the analysis.

In other features, the server is further configured to monitor trends in the distribution, identify one or more vehicles in which one or more cell groups continue to fail, and send notifications to the identified vehicles.

In still other features, a method for monitoring a battery of a vehicle comprises measuring a charging current of the battery comprising a plurality of cell groups connected to each other while the battery is being charged using one of a plurality of charging systems. The method comprises measuring voltages of the cell groups while the battery is being charged using the one of the plurality of charging systems. The method comprises defining a plurality operating regions in a charging current profile of the battery during a charging cycle of the vehicle while the battery is being charged using the one of the plurality of charging systems. The method comprises filtering the charging current and the voltages measured in the operating regions. The method comprises calculating internal resistances of the cell groups in the operating regions based on the filtered current and voltages. The method comprises generating at least one of statistical values and distance metrics based on the internal resistances of the cell groups. The distance metrics are generated by dividing differences between the internal resistances and mean values of the internal resistances by a standard deviation of the internal resistances. The method comprises determining whether one or more of the cell groups is faulty based on the at least one of the statistical values and the distance metrics irrespective of the plurality of charging systems used to charge the battery.

In another feature, the method further comprises determining whether the one or more of the cell groups is faulty based on at least one of (i) a highest value of differences between maximum and minimum values of one or more of the statistical values across the cell groups and (ii) a highest value of the distance metrics across the cell groups.

In another feature, the method further comprises determining whether the one or more of the cell groups is faulty based on the at least one of the statistical values and the distance metrics computed for each of the plurality of charging systems used to charge the battery.

In another feature, the method further comprises defining one of the operating regions based on the charging current, temperature, and state of charge of the battery when the charging current is stable for a predetermined time period in the one of the operating regions.

In other features, the method further comprises defining the operating regions based on predetermined ranges of the charging current, temperature, and state of charge of the battery; and determining whether the one or more of the cell groups is faulty regardless of changes in temperature and state of charge of the battery.

In other features, the method further comprises defining a plurality of bands within one of the operating regions based on a predetermined range of the charging current and a plurality of predetermined ranges of temperature and state of charge of the battery. The method further comprises calculating the internal resistances of the cell groups in the bands based on the filtered current and the voltages. The method further comprises generating individual statistical values for the bands based on the internal resistances of the cell groups in the bands. The method further comprises determining differences between maximum and minimum values of one or more of the individual statistical values. The method further comprises selecting internal resistance data of the cell groups from one of the bands corresponding to a highest value of the differences between maximum and minimum values. The method further comprises diagnosing the health of the battery based on the selected internal resistance data.

In other features, the method further comprises selecting internal resistance data of the cell groups from one of the operating regions corresponding to a highest value of differences between maximum and minimum values of one or more of the statistical values across the cell groups. The method further comprises storing information including at least one of the selected internal resistance data and a highest value of the distance metrics across the cell groups for diagnosing the one or more of the cell groups. The method further comprises sending the stored information to a server for prognostics and determining a trend in a health of the battery. The method further comprises providing a message regarding the health of the battery based on the stored information.

In other features, the method further comprises, for each of the plurality of charging systems used to charge the battery, selecting internal resistance data of the cell groups from one of the operating regions corresponding to a highest value of differences between maximum and minimum values of one or more of the statistical values across the cell groups. The method further comprises storing the at least one of the selected internal resistance data and a highest value of the distance metrics. The method further comprises comparing the at least one of the selected internal resistance data and the highest value of the distance metrics to respective thresholds calibrated for the plurality of charging systems. The method further comprises determining whether one or more of the cell groups are failing across the plurality of charging systems.

In other features, the method further comprises, at a server, receiving the at least one of the selected internal resistance data and a highest value of the distance metrics from a plurality of vehicles, analyzing a distribution of the at least one of the selected internal resistance data and the highest value of the distance metrics, and calibrating the thresholds based on the analysis.

In other features, the method further comprises, at the server, monitoring trends in the distribution, identifying one or more vehicles in which one or more cell groups continue to fail, and sending notifications to the identified vehicles.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 shows an example of a control system of an electric vehicle;

FIG. 4 shows an example of a current profile of the battery during a charging cycle of the electric vehicle;

In the drawings, reference numbers may be reused to identify similar and/or identical elements.

DETAILED DESCRIPTION

Figure 2A:
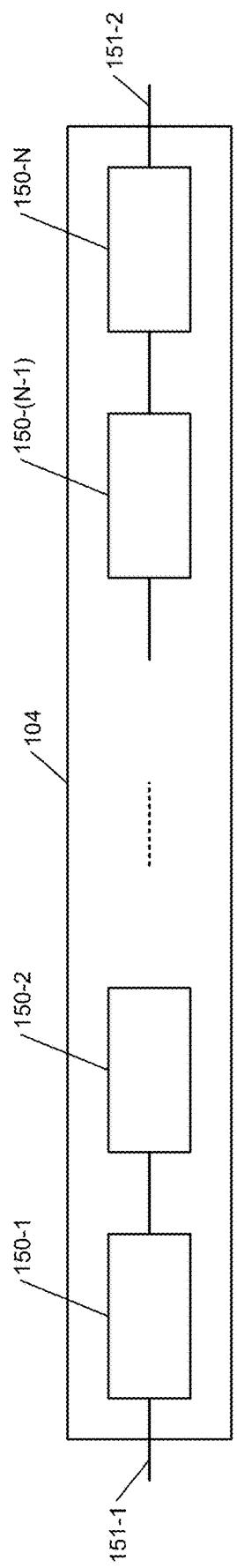
FIGS. 2A and 2B show an example of a battery of the electric vehicle comprising cell groups.

The present disclosure provides a system and a method to estimate an internal resistance of a battery of an electric vehicle and to monitor battery performance at individual cell level to detect failures due to high internal resistance. The method is performed while the battery of the electric vehicle is being charged using any of the various charging methods. The charging methods include L1 charging using 120 VAC power supply, L2 charging using 240 VAC power supply, and DC fast charging (DCFC). The charging current profile of a battery differs depending on the charging method used. Consequently, the internal resistance of the battery exhibits different behaviors in different charging methods. The present disclosure provides a robust internal resistance estimator implemented in a controller of the vehicle while considering different noise factors. The estimator estimates the internal resistance of the battery regardless of the charging method used to charge the battery. The estimator is designed to optimize the memory of the controller. The estimator provides health indicators that allow detecting abnormalities in cells and identifying abnormal cells in the battery at an early stage.

Specifically, the estimator provides a health indicator that is monitored to characterize the internal resistance of the battery to quantify degradation in battery performance. The estimator provides an ability to detect abnormal behavior at each individual cell group level and to isolate failures to specific cell groups. The estimator is implemented in an onboard controller in the vehicle to estimate the internal resistances of individual cell groups, which is referred to as the health indicator. Various pack level features and cell group level features are computed based on the estimated internal resistances of individual cell groups. The features can be used for diagnosing faulty cell groups in the battery. Additionally, the features can be transmitted to a server in a cloud for monitoring trends and for performing prognostics and service/diagnostics.

The present disclosure provides a generalized system for estimating battery charging resistance during L1, L2 and DCFC charging scenarios, to monitor battery performance at individual cell group level and to detect/isolate faulty cell groups. The system provides a solution to design a robust resistance estimator while considering different noise factors and yet optimize the in-vehicle implementation process across different charging profiles. The designed health indicators provide ability to detect and identify abnormal cell or cells in a high voltage battery at an early stage.

As explained below in detail, the system automatically detects and selects operating condition based on constant current charging phase for different charging profiles. The system monitors metrics designed to characterize battery internal resistance and to quantify battery performance degradation based on the metrics. The system can detect abnormal behavior at each individual cell group level and can isolate failures to specific cell groups/modules. The system resides in an onboard controller in the vehicle to estimate the internal resistance as a health indicator for individual cell groups. The calculated features can be transmitted to a cloud for monitoring trends and for diagnostics and prognostics purposes.

More specifically, the system for estimating the internal resistances of the individual cell groups of the battery and monitoring the overall health of the battery pack utilize multiple narrower operating regions of the battery's charging current profile regardless of the charging method used to charge the battery. The multiple narrower operating regions of the battery are used to estimate the internal resistance of the battery and to minimize the impact of battery conditions (e.g., temperature, state of charge (SOC), and current) on the internal resistance estimation. The system estimates the internal resistance of the battery in each of the operating regions and tracks statistical features such as minimum, maximum, average and other values of the internal resistance for each individual operating region. The system uses a low pass filter to filter the charging current and to filter cell voltages to minimize the impacts of high frequency measurement noise and the variational impacts of the system dynamics. The system uses stability criteria (explained below) for the filtered current as a threshold condition to compute the internal resistance of each cell group.

The system performs the internal resistance estimations based on a DC-equivalent circuit model for each cell group, which is expressed as $R=[V-OCV]/I$, where $V$ and $I$ are filtered cell group voltages and filtered battery pack current, respectively; and OCV is the open circuit voltage of the battery pack. By using a pack level resistance difference as a feature, the system selects optimal internal resistance data for tracking the internal resistances of the cell groups in the multiple operating regions. The system provides the ability to compute the internal resistance of the battery in multiple narrow operating regions and stores only the optimal data in the memory of the controller that indicates the maximum resistance spread across different cell groups within the battery pack. Storing only the optimal data optimizes the memory requirement and memory usage in the controller.

The system uses the optimal data selected based on the resistance statistics to detect abnormal behavior at each individual cell group level and to isolate failures to specific cell groups/modules within a battery pack. The system also calculates distance metrics to detect outlier cells (i.e., cells with abnormal internal resistances relative to the rest of the cells in the battery pack) as explained below in detail. The system monitors failure progression in the cells of the battery and sends proactive alerts/notifications to warn customers ahead of a failure and to avoid vehicle stalls. The system manages the vehicle operation when faults are detected. The calculated features can be transmitted to a server in a cloud for monitoring trends in the health of the battery and for performing prognostics and to aid service/ diagnostics of the battery. Final health indicator data (historical statistics) observed from each vehicle provides diagnostic data for service technicians to assess the battery health. The distribution of the historical data for a fleet of vehicles can be used to learn the behavior of the charging resistance for different charging methods, which can be used to design the estimator to track internal resistance degradation. The system resides in an onboard controller in the vehicle to estimate the internal resistance (i.e., the health indicator) for individual cell groups. The system provides a passive approach for the internal resistance estimation, which does not impact driving the electric vehicle. These and other features of the present disclosure are described below in detail.

The present disclosure is organized as follows. Initially, a block diagram of a control system of an electric vehicle is shown and described with reference to FIG. 1. Examples of cell groups of a battery of the electric vehicle are shown and described with reference to FIGS. 2A and 2B. Examples of factors affecting the internal resistances of the battery are shown and described with reference to FIGS. 3A-3D. An example of a charging current profile of the battery and examples of operating regions defined in the charging current profile are shown and described with reference to FIG. 4. An example of a health monitoring system for the battery is shown and described with reference to FIG. 5. An overall method used by the health monitoring system of FIG. 5 to monitor and assess the health of the battery is shown and described with reference to FIGS. 6A and 6B. Subsequently, the steps of the method of FIG. 6 are shown and described in further detail with reference to FIGS. 7-11. The spreads in the internal resistances of the cell groups are shown and described with reference to FIGS. 12A-12E.

FIG. 1 shows an example of a control system 100 of an electric vehicle. The control system 100 comprises a controller 102, a battery 104, a battery management system (BMS) 106, an infotainment subsystem 108, and an autonomous driving subsystem (implementing SAE Levels 1-5) 112. The battery 104 can be charged using an L1 charging system 130-1, an L2 charging system 130-2, and a DCFC charging system 130-3 (collectively the charging systems 130). The controller 102 communicates with the battery 104 and implements a health monitoring system shown and described below in detail with reference to FIG. 5. The controller 102 communicates with the various subsystems of the vehicle. The battery 104 supplies power to the various subsystems of the electric vehicle. The BMS 106 performs battery management operations, which include monitoring the battery 104 and supplying power from the battery 104 to the various subsystems of the vehicle. The health monitoring system can also be implemented in the BMS 106.

The infotainment subsystem 108 may include audiovisual multimedia subsystems and a human to machine interface (HMI) that allows occupants of the electric vehicle to interact with the control system 100. The infotainment subsystem 108 also provides alerts provided by the health monitoring system to the occupants of the electric vehicle via the HMI.

The control system 100 further comprises a plurality of navigation sensors 114 that provide navigation data to the autonomous driving subsystem 112. For example, the navigation sensors 114 may include cameras, radar and Lidar sensors, a global positioning system (GPS), and so on. Based on the data received from the navigation sensors 114, the autonomous driving subsystem 112 controls a steering subsystem 116 and a braking subsystem 118 of the electric vehicle. The autonomous driving subsystem 112 also controls and manages the operation of the electric vehicle based on data regarding the health of the battery 104 received from the health monitoring system (e.g., from the controller 102 or the BMS 106).

The control system 100 further comprises a communication subsystem 120 that can communicate with one or more servers 122 in a cloud via a distributed communications network 124. For example, the distributed communications network 124 may include a cellular network, a satellite-based communication network, a Wi-Fi network, the Internet, and so on. The communication subsystem 120 may include one or more transceivers for communicating with the distributed communications network 124. The controller 102 communicates with the one or more servers 122 in the cloud via the communication subsystem 120. The controller 102 communicates the data from the battery 104 processed by the health monitoring system (described below) to the one or more servers 122 via the communication subsystem 120. The controller 102 generates alerts based on the data from the battery 104 processed by the health monitoring system and provides the alerts to the occupants of the electric vehicle via the HMI of the infotainment subsystem 108. The controller 102 may also receive alerts from the one or more servers 122 based on the data from the battery 104 processed by the one or more servers 122 and provides the alerts to the occupants of the electric vehicle via the HMI of the infotainment subsystem 108.

Figure 2B:
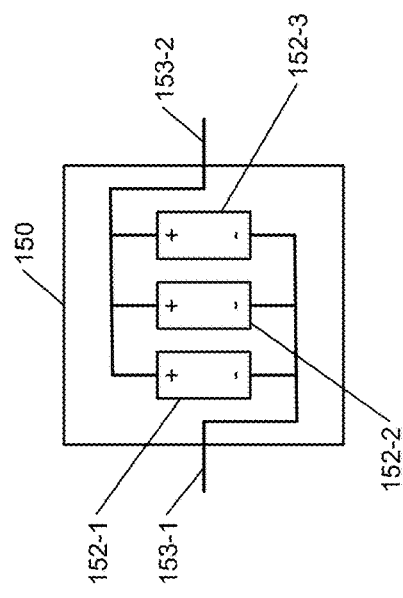

FIGS. 2A and 2B shows an example of the battery 104 comprising one or more battery packs. Hereinafter, the term battery and battery pack are used interchangeably. In general, the battery 104 may comprise a plurality of battery packs. Each battery pack may comprise a plurality of modules. Each module may comprise a plurality of cell groups. Each cell group may comprise a plurality of cells.

In FIG. 2A, the battery 104 comprises one or more battery packs each comprising a plurality of cell groups. For example, the battery 104 comprises cell group 1 150-1, cell group 2 150-2, ..., cell group 150-(N−1), and cell group N 150-N, where N is a positive integer (collectively the cell groups 150). The cell groups 150 are connected to each other in series. For each battery pack comprising the cell groups 150, a pack level current I through the cell groups 150 of the battery pack is measured by measuring current through terminals 151-1, 151-2 (collectively the terminals 151) of the battery pack comprising the cell groups 150. The current measurement is described below with reference to FIG. 5.

In FIG. 2B, each cell group 150 comprises a plurality of cells (e.g., 3 cells). For example, each cell group 150 comprises cells 152-1, 152-2, and 152-3 (collectively the cells 152). While only 3 cells are shown for example only, each cell group 150 may include fewer or more than three cells 152. The cells 152 in each cell group 150 are connected to each other in parallel, in series, or using a combination of series and parallel connections. Voltages across each individual cell group 150 are measured across terminals 153-1, 153-2 (collectively the terminals 153) of each cell group 150. The voltage measurements are described below with reference to FIG. 5.

Accordingly, for each battery pack comprising the N cell groups 150, the pack level current I (also called the battery current I throughout the present disclosure) and N voltages across the N cell groups 150 are measured. These current and voltage measurements allow calculation of internal resistances of each individual cell group 150. The internal resistance of the battery 104 can be used as a health indicator to indicate the health of the battery 104.

The health monitoring system, which is described below in detail with reference to FIG. 5, generates the health indicator by taking into account various factors that impact the internal resistance of the battery 104. For example, the factors include but are not limited to temperature, state of charge (SOC), and current of the battery 104. The health monitoring system can identify and isolate one or more cell groups 150 that are faulty and that contribute the most to the performance degradation of the battery 104. To identify and isolate one or more cell groups 150 that are faulty, the health monitoring system can process the pack level current and the voltages of individual cell groups 150 in the onboard controller (e.g., the controller 102), in the cloud (e.g., in the one or more servers 122), or using a combination of both. The health monitoring system can provide the health indication of the battery 104 in the form of proactive alerts to an occupant of the electric vehicle and to service technicians for prognostics and diagnostics purposes as described below in detail.

FIGS. 3A-3D show how the internal resistance of the battery 104 is impacted by various factors such as temperature, SOC, and charging current of the battery 104 in different charging methods. For example, in FIG. 3A, the behavior of the internal resistance R of the cell groups of the battery 104 may vary with the SOC during charging of the battery 104. For example, as the battery 104 is being charged, the SOC of the battery 104 increases. The internal resistance of the cell groups may remain within a relatively narrow range 132 until the SOC reaches a predetermined level shown at 134. Thereafter, as the battery 104 continues to charge, the internal resistance of most of the healthy (i.e., normally operating) cell groups may still remain within the relatively narrow range 132. However, the internal resistance of one or more of the unhealthy or defective (i.e., abnormal) cell groups may deviate from the relatively narrow range 132 and may exhibit an increased internal resistance as shown at 136. If an average of the internal resistances of all of the cell groups is considered over the entire charging cycle of the battery 104, the deviation may not be evident. Therefore, the system of the present disclosure uses a method of defining narrow operating regions in the charging current profile of the battery 104 to detect the abnormal cell groups.

Figure 3A:
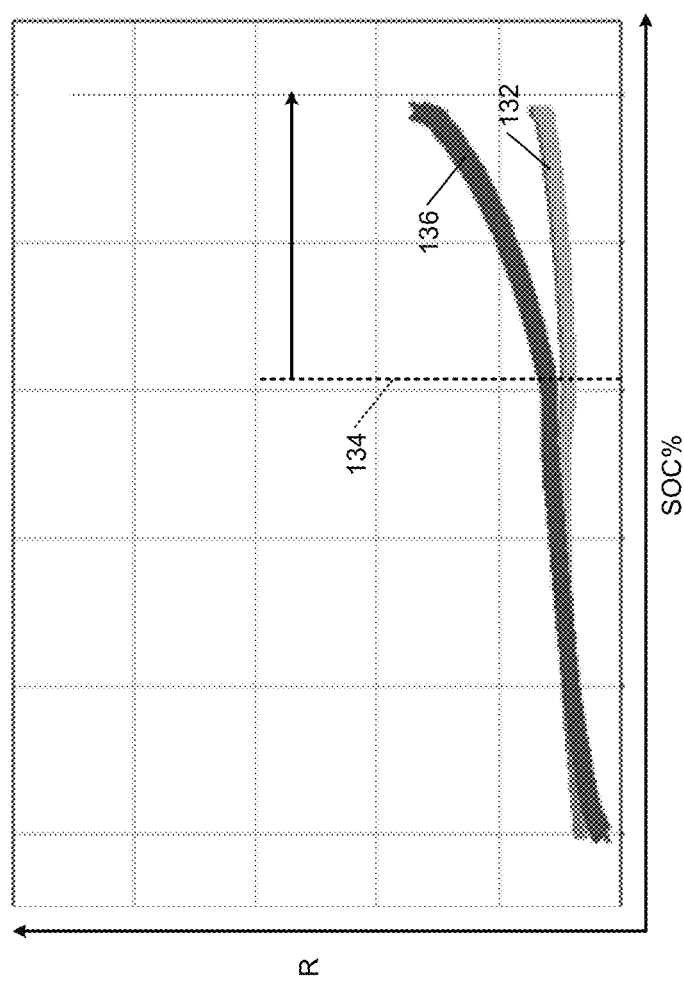
FIGS. 3A-3D show examples of factors affecting an internal resistance of the battery.
Figure 3B:
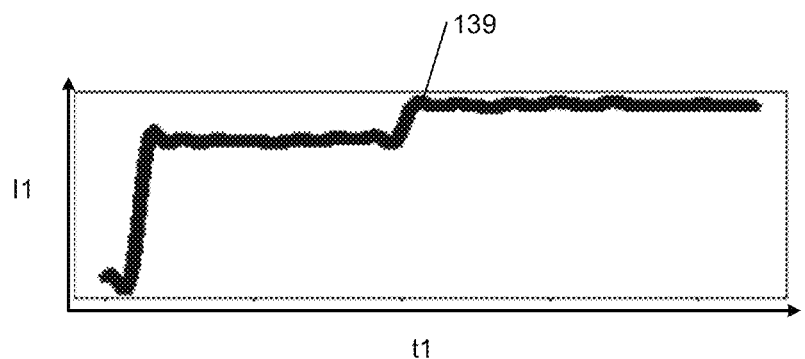
Figure 3C:
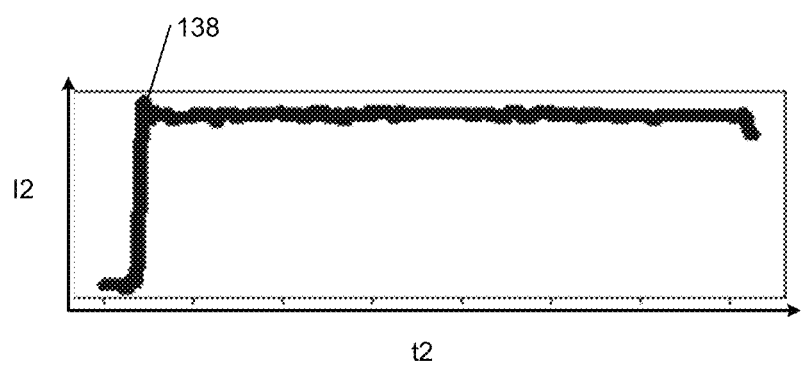
Figure 3D:
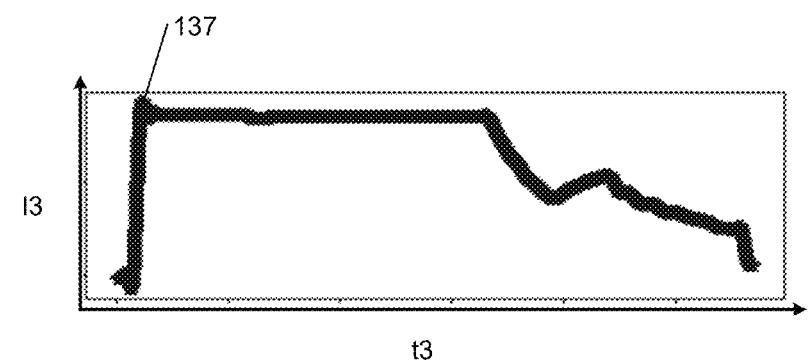

Furthermore, FIGS. 3B-3D show that the battery 104 may exhibit different charging current profiles depending on the type of charging method used. For example, FIGS. 3B-3D show charging current profiles of the battery 104 when the battery 104 is charged using L1, L2, and DCFC charging methods, respectively. In each charging method, the charging current I and the charging time t are different and are respectively denoted as I1, I2, I3; and t1, t2, t3. In each charging method, the peak charging currents are different and are reached at different times. Specifically, the peak charging current (shown at 137) is highest and occurs earliest in DCFC charging; the peak charging current (shown at 138) is less and occurs later in L2 charging than in DCFC charging, and the peak charging current (shown at 139) still less and occurs still later in L1 charging than in DCFC and L2 charging.

Due to the differences in charging current profiles in the different charging methods, multiple operating regions would normally have to be defined for each charging method. However, defining multiple operating regions based on each charging method is computationally not optimal. Instead, the system of the present disclosure automatically selects and defines narrower operating regions irrespective of the different charging methods used and provides a generalized method that works for all of the charging methods and battery operating conditions. As explained below in detail, the system selects optimal internal resistance data for monitoring the health of a high voltage battery pack and uses the optimal internal resistance data to detect and isolate one or more faulty cell groups and for prognostics purposes. Specifically, the health monitoring system of the present disclosure described below divides the charging current profile of the battery 104 into narrow operating regions and measures the charging current of the battery 104 and the voltages of the cell groups 150 in each operating region to smooth out the effects of the battery operating conditions as described below.

FIG. 4 shows an example of a charging current profile of the battery 104 during a charging cycle. For example, the charging current profile is shown for DCFC charging although any other charging method may be used instead. Since the charging current and the operating conditions of the battery 104 vary during charging, the entire charging current profile of the battery 104 is not selected for the current and voltage measurements. Instead, a plurality of operating regions 160-1, . . . , and 160-M, where M is a positive integer (collectively the operating regions 160) of the charging current profile of the battery 104 over the charging cycle are selected. The procedure for defining the operating regions 160 is described below in further detail with reference to FIGS. 6A, 6B, and 7.

Briefly, each operating region 160 is a function of the charging current I, SOC, and temperature T of the battery 104. Each operating region 160 is selected where the charging current is relatively stable (i.e., is within a narrow range) at time t for a selected SOC and temperature T of the battery 104 as explained below in detail with reference to FIGS. 8A and 8B. The selected SOC and temperature T of the battery 104 can be calibrated parameters. For example, these parameters can be set when the battery 104 is manufactured and can be altered via over the air updates provided to the vehicle during the life of the vehicle.

Figure 5:
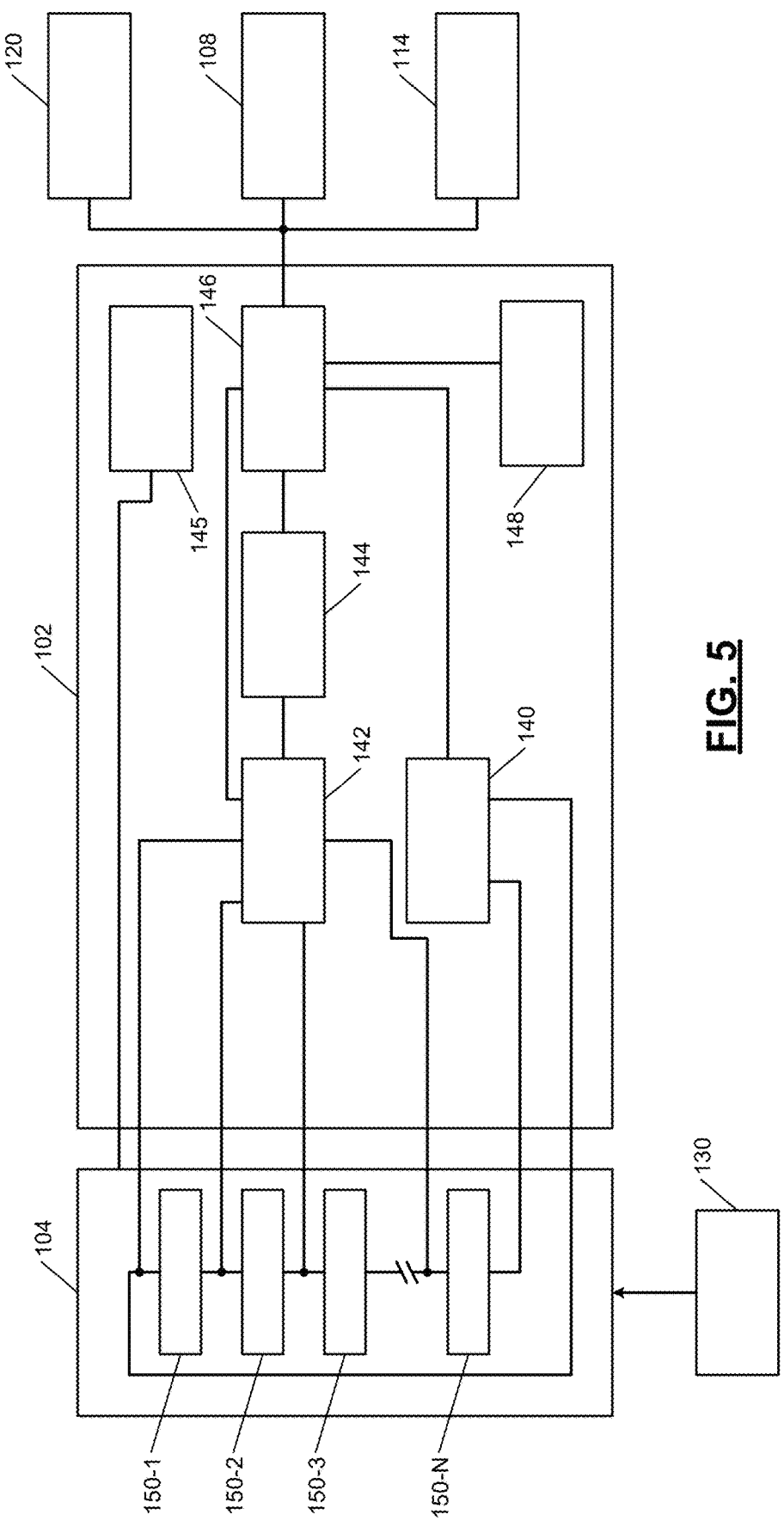
FIG. 5 shows an example of a health monitoring system for the battery.
Figure 6A:
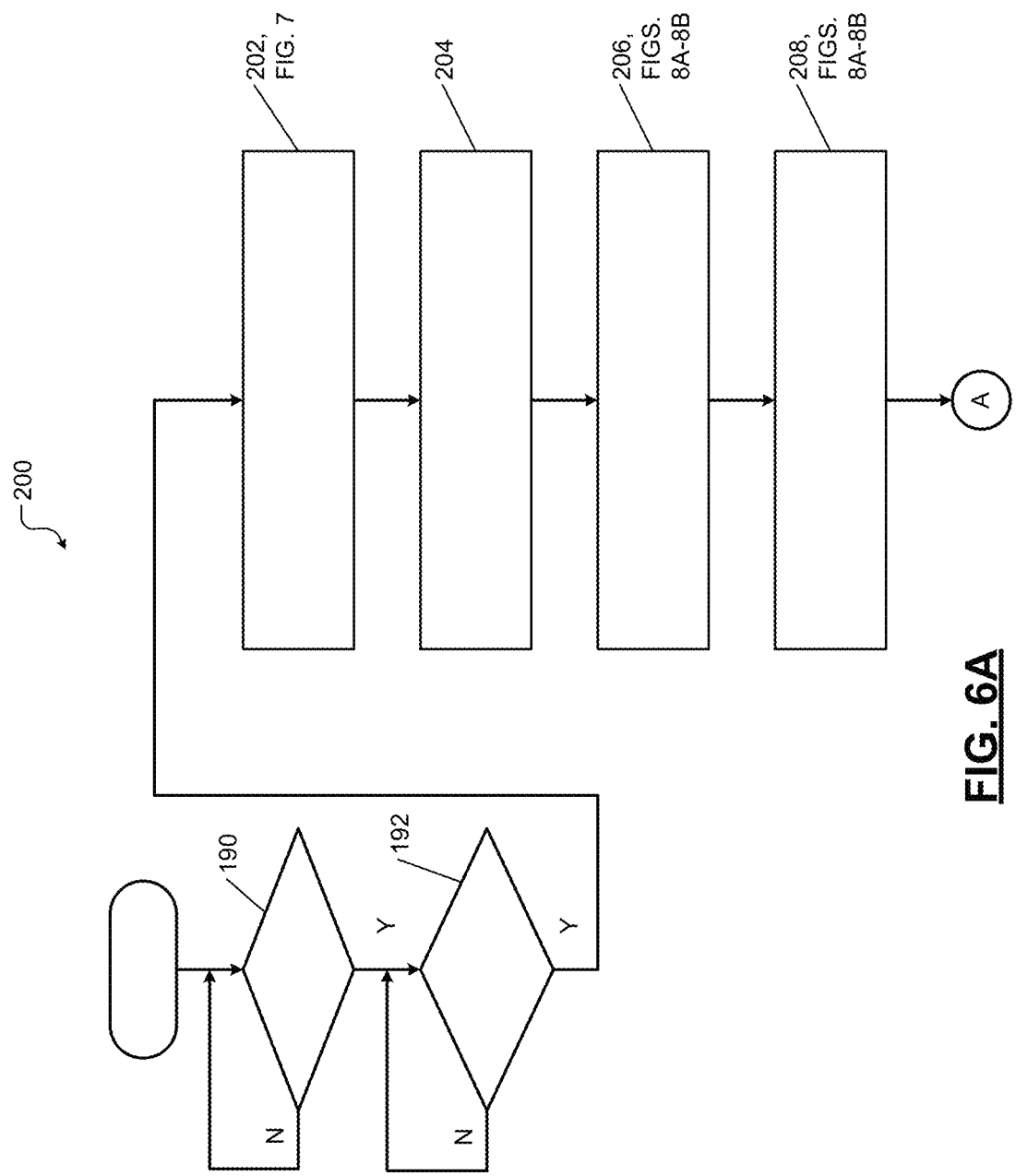
FIGS. 6A and 6B show a method for monitoring and assessing the health of the battery.
Figure 6B:
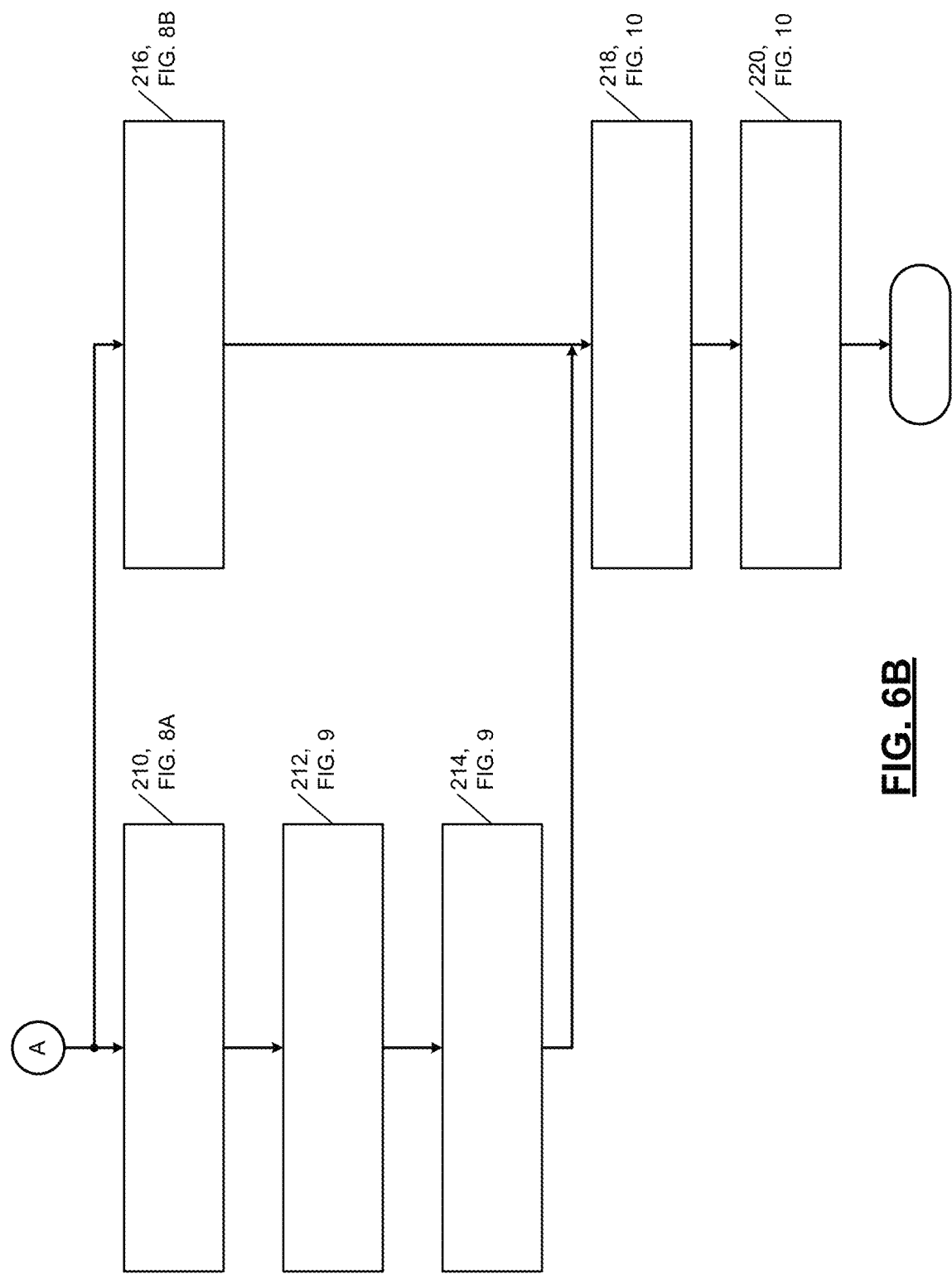

FIG. 5 shows an example of the health monitoring system implemented in the controller 102. The health monitoring system comprises a current measuring circuit 140, a multiplexer 142, a voltage measuring circuit 144, a temperature sensing circuit 145, a processor 146, and memory 148. The current measuring circuit 140 measures the charging current I through the N cell groups 150. The multiplexer 142 connects the voltage measuring circuit 144 across each of the cell groups 150. The processor 146 controls the multiplexer 142. The voltage measuring circuit 144 measures the voltages across each of the cell groups 150. The temperature sensing circuit 145 senses the temperature of the battery 104. The processor 146 processes the current and voltage measurements and stores only selected processed data in the memory 148 as described below with reference to FIGS. 6-11. Due to the selective storage of processed data, the size (i.e., amount) and usage of the memory 148 are optimized.

FIGS. 6A and 6B show a method 200 for generating a health indicator based on internal resistances of the cell groups 150 in multiple operating regions 160 according to the present disclosure. The health indicator may include a statistical metric, a distance metric, or both. That is, the system can use the statistical metric, the distance metric, or a combination of both. FIGS. 7-11 show some of the steps of the method 200 in further detail. The method 200 is performed by the health monitoring system of FIG. 5. For example, the processor 146 along with the other circuits of the controller 102 may perform the method 200.

In FIGS. 6A and 6B, at 190, the method 200 determines if the battery 104 is charging. If the battery 104 is charging, at 192, the method 200 determines if the battery operating conditions are stable. Specifically, the method 200 determines if the following conditions are met for at least a predetermined time period: SOC>x %, and charging current I>a threshold (to avoid low currents), where both x and the threshold are calibratable parameters. Further, the method 200 determines if the charging current I is stable by determining whether at time t, $I(t)-I(t-1)<$a predetermined threshold, which is also a calibratable parameter. For example, in the charging current profile shown in FIG. 4, the charging current is stable from 160-1 to 160-M.

At 202, the method 200 defines the operating regions 160 in the charging current profile of the battery 104 as a function of the charging current I, SOC, and temperature T of the battery 104. Defining the operating regions 160 is described in further detail with reference to FIG. 7. At 204, for each operating region 160, the method 200 measures the charging current I through the battery pack (i.e., through the N cell groups 150), voltages across each cell group 150, and the average temperature of the battery 104 as explained above with reference to FIG. 5.

At 206, the method 200 uses a low pass filter to filter the measured current I through the battery pack and the voltages measured across each cell group 150. The low pass filtering is performed to minimize high frequency noise in the current and voltage measurements and to reduce the impact of diffusion and charge transfer phenomena that occur in the battery 104. For example, the diffusion and charge transfer phenomena can be approximated as respective resistance-capacitance (RC) pairs. The low pass filtering reduces the effects of these capacitances at lower frequencies so that the internal resistances of the cell groups 150 can be accurately measured. In addition, the method 200 uses stability criteria to estimate the internal resistances when the current I is stable. The stability criteria are described in further detail with reference to FIGS. 8A and 8B.

At 208, for each cell group, the method 200 estimates the internal resistances of the cell groups 150 based on the filtered current I and the filtered voltages of the cell groups 150 measured in each operating region 160. Subsequently, the method 200 can determine statistical metrics based on the estimated internal resistance in steps 210, 212, and 214; or the method 200 can computer distance metrics in step 216; or the method 200 can determine both the statistical metrics and the distance metrics in parallel.

At 210, the method computes internal resistance statistics (e.g., minimum, maximum, average, and other values of the internal resistances) estimated for each cell group 150 in each operating region 160. While minimum, maximum, average values are used throughout the present disclosure for example only, the statistics can also include other statistical data including but not limited to standard deviation, variance, and so on. The statistics are also called summary statistics. The estimation of the internal resistances and the computation of the statistics are described in further detail with reference to FIG. 8A.

At 212, the method 200 selects only the optimal data that captures or indicates maximum deviation in the internal resistance across the cell groups 150. Selecting the optimal data ensures that only the data from the cell group or cell groups 150 that is/are maximally contributing to the increase in the internal resistance of the battery 204 is considered, and any outliers that are only marginally contributing to the increase in the internal resistance of the battery 204 are not considered. The selection criteria are described in further detail with reference to FIG. 9.

At 214, the method 200 saves only the selected data in the memory 148 of the controller 102 for diagnostic monitoring (e.g., by a service technician and/or to send a message about the health of the battery to the infotainment subsystem 108). The method 200 can also upload the selected data to the one or more servers 122 in the cloud for performing prognostics and trending of the health of the battery 104. Saving only the selected data optimizes the size and use of the memory 148.

At 216, the method 200 computes a distance metric $D_i$ for each cell group 150 to detect outlier cell groups (i.e., cell groups for which the internal resistances of cells diverge from the internal resistances of the cells in most other cell groups). The computation of the distance metrics is described in further detail with reference to FIG. 8B.

At 218, the method 200 detects failing cell groups (i.e., cell groups with abnormally high internal resistances) based on the statistical data generated at 214, the distance metrics generated at 216, or both. The method 200 can utilize either the statistical data or the distance metrics to detect failing cell groups. Alternatively, the method 200 can utilize both the statistical data and the distance metrics to detect failing cell groups.

When both the statistical data and the distance metrics are used, at 220, the method 200 combines the results from detections made based on both the statistical data and the distance metrics to confirm which cell groups are failing. The detection of the failing cell groups performed in steps 218 and 220 is described in further detail with reference to FIG. 10. The method 200 generates a notification indicating the failing cell groups (e.g., via the infotainment subsystem 108), and the method 200 ends.

Figure 7:
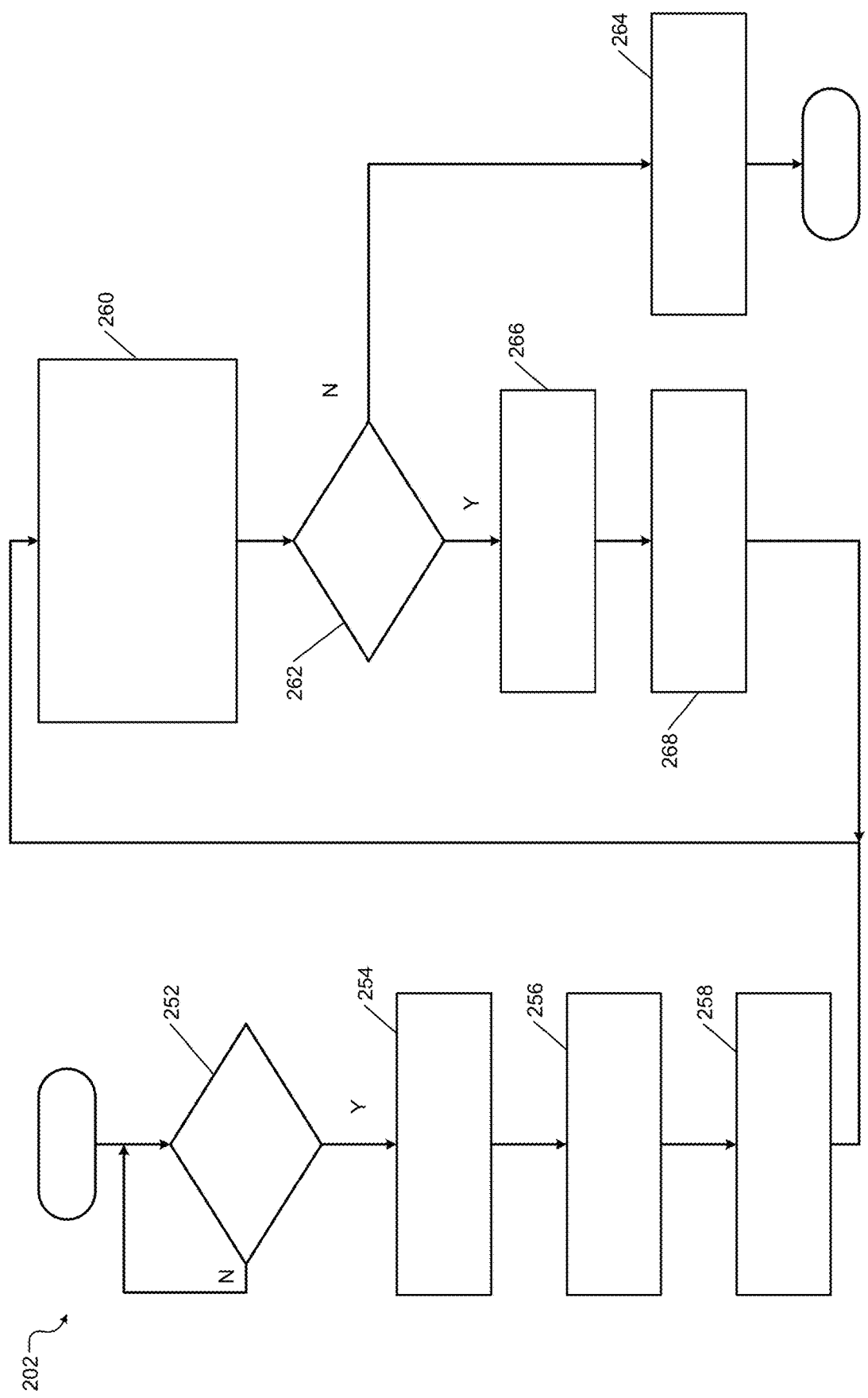
FIGS. 7-11 show the method of FIG. 6 in further detail.

FIG. 7 shows a procedure for defining the operating regions 160 in the charging current profile of the battery 104 as a function of the current I, SOC, and temperature T of the battery 104 (i.e., step 202 of the method 200 shown in FIG. 6) in further detail. In the following description of FIG. 7, step 202 of the method 200 is simply referred to as method 202. At 252, the method 202 determines if the charging current I is stable in a selected narrow range at time t. The method 202 waits until the charging current I is stable in the selected narrow range. The stability criteria used to determine whether the current I is stable are described below with reference to FIGS. 8A and 8B.

If the charging current I is stable in the selected narrow range at time t, at 254, the method 202 obtains the SOC of the battery 104 at time t as SOC(t) and the average temperature of the battery 104 at time t as T(t). At 256, the method 202 selects a calibrated SOC range (e.g., SOC(t)+X %, where X is a positive integer). At 258, the method 202 selects B temperature ranges around T(t) (e.g., T(t)±Y, where Y is an integer), where B is a positive integer.

At 260, the method 202 defines B bands (e.g., B=3) in each operating regions 160 as follows. A first band, Band 1: The selected narrow current range for the current I, SOC (t)+X %, and a first temperature range (e.g., by selecting a first value of Y); a second band, Band 2: The selected narrow current range for the current I, which is the same for Band 1, SOC(t)+X %, which is also the same for Band 1, and a second temperature range (e.g., by selecting a second value of Y); and a third band, Band 3: The selected narrow current range for the current I, which is the same for Band 1, SOC(t)+X %, which is also the same for Band 1, and a third temperature range (e.g., by selecting a third value of Y).

Note that the SOC and the temperature can vary during the charging cycle. While all three bands can have different temperature ranges, two of the three bands can have overlapping temperature ranges. Further, instead of keeping the SOC constant across the three bands and selecting different temperature ranges, the temperature can be kept constant across the three bands, and different SOC ranges can be selected for at least two of the three bands. Further, while B=3 is used throughout the present disclosure for simplicity of illustration only, the methodology similar to that described above can be extended to any number of bands. Furthermore, the number of bands can vary across different operating regions 160. The bands can also be called sub-regions of the operating regions 160.

At 262, the method 202 determines if the operating conditions (i.e., SOC and temperature T) of the battery 104 have changed. If the operating conditions have not changed, at 264, the method 202 defines the selected narrow current range as the operating region 160 in the charging current profile of the battery 104.

However, the SOC of the battery 104 can change more than SOC(t)+X %. Alternatively, or additionally, the average temperature T of the battery 104 can also change more than T(t)±Y. If the operating conditions (i.e., the SOC and/or the average temperature T) of the battery 104 have changed, the method 202 reconstructs new B bands as follows.

Before reconstructing the new bands, the method 200 determines if the existing bands have sufficient samples. If the existing bands have sufficient samples, the method 200 stores a copy of the data and the band with a maximum DeltaR (explained below with reference to FIG. 9).

At 266, to reconstruct new bands, the method 202 selects a new time t, a new SOC(t), and a new T(t) for the selected narrow range of the charging current I. At 268, the method 202 selects new B temperature ranges around the new T(t) (e.g., T(t)±Z, where Z is an integer), and the method 202 repeats the steps 260 and 262 until an operating region can be defined. Subsequently, the method 202 returns to estimate the internal resistances for the cell groups 150 in the defined operating region 160 (i.e., in the selected narrow range of the current I) and computes the summary statistics and/or the distance metrics for the cell groups 150 in the defined operating region 160 as described above with reference to FIG. 6.

Figure 8A:
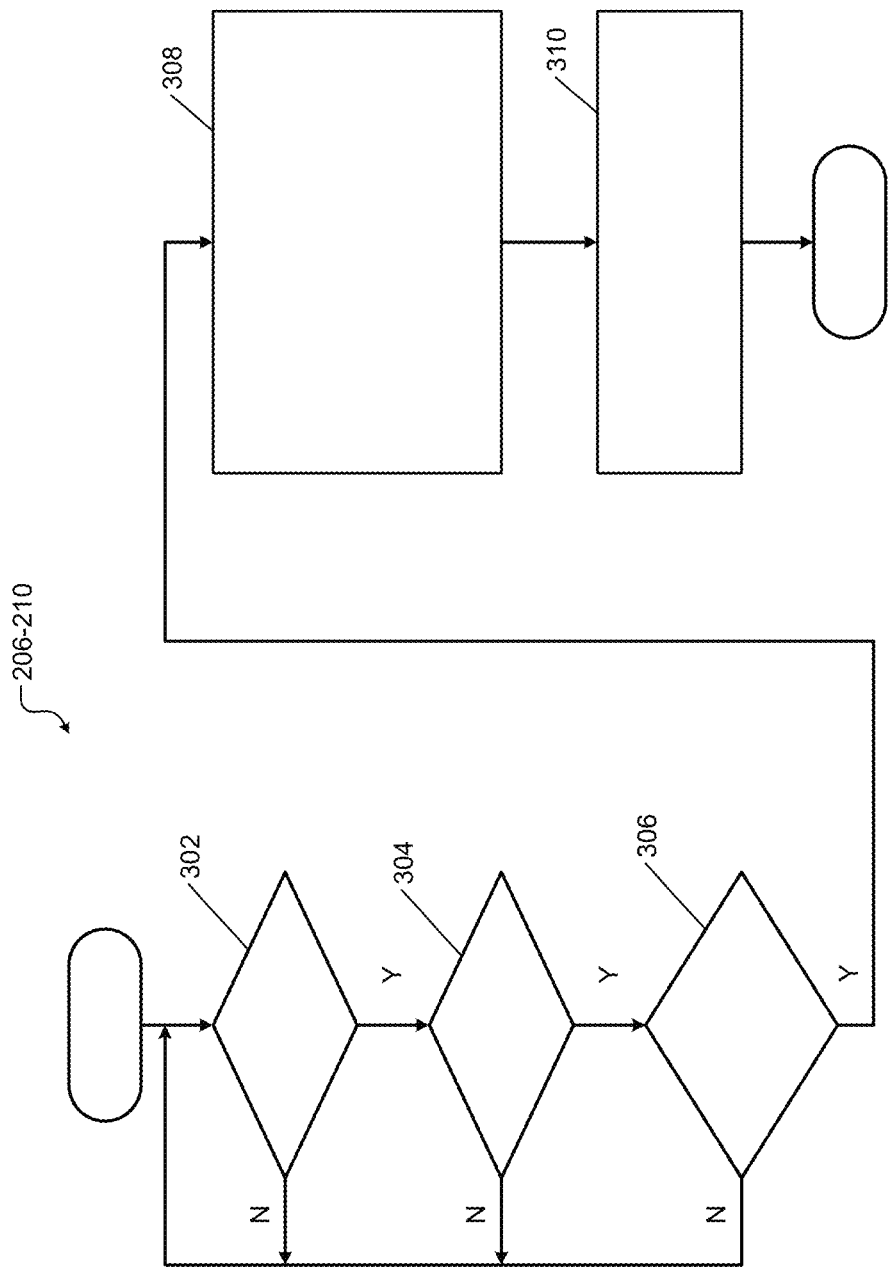

FIG. 8A shows steps 206-210 of the method 200 shown in FIG. 6 in further detail. The following procedure is performed for the cell groups 150 in each operating region 160. After filtering the charging current I and the voltages measured across the cell groups 150 in an operating region 160, the method 200 applies the stability criteria and estimates the internal resistances of the cell groups 150 as follows.

At 302, the method 200 determines if the filtered current I is within a predetermined range (e.g., the selected narrow range described above with reference to FIG. 7). The method 200 waits if the filtered current I is not within the predetermined range. If the filtered current I is within the predetermined range, at 304, the method 200 determines if the SOC of the battery 104 is within a predetermined range. The method 200 waits if the SOC is not within the predetermined range.

If both the filtered current I and the SOC are with their respective predetermined ranges, at 306, the method 200 determines if the filtered current I is stable. For example, the method 200 determines that the filtered current I is stable if a first derivative of the filtered current is within a first predetermined range for a predetermined time period. In some implementations, the method 200 determines that the filtered current I is stable if a second derivative of the filtered current is also within a second predetermined range for the predetermined time period.

The method 200 waits if the filtered current I is stable. If both the filtered current I is stable and the SOC is within the predetermined range, at 308, the method 200 calculates the internal resistances of the cell groups 150 in the operating region 160 as follows.

For i=1 to N (N=no. of cell groups 150), the method 200 calculates the internal resistances using the following equation: $R_i(t)=[V_f(t)_i-V_{ocv}(t)]/I_f(t)$, where t is the index of time; $R_i$ is the internal resistance of the $i^{th}$ cell group 150, $V_f$ and $I_f$ are respectively the filtered voltage of the $i^{th}$ cell group 150 and the filtered current I of the battery 104, and Vocv is the open circuit voltage of the battery 104 obtained from a pre-calibrated SOC-to-OCV curve for the battery 104.

At 310, the method 200 computes the summary statistics for each of the cell groups 150 in the operating region 160. For example, the summary statistics include Max $R_i$, Min $R_i$, Avg. $R_i$ for i=1 to N (N=no. of cell groups 150). The summary statistics are calculated for all the cell groups 150 for each operating region 160 during a charging cycle.

Figure 8B:
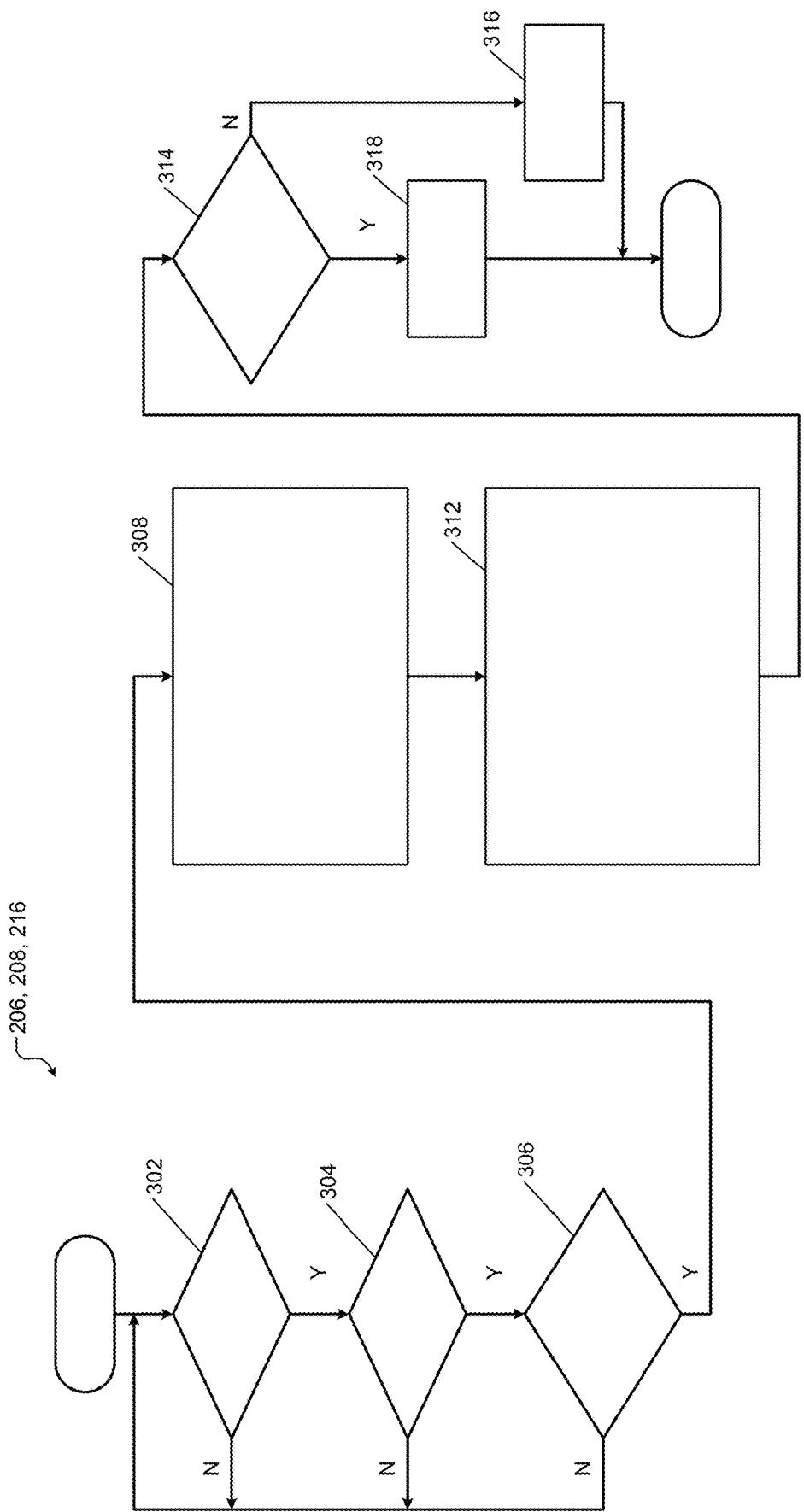

FIG. 8B shows steps 206, 208, and 216 of the method 200 shown in FIG. 6 in further detail. The following procedure is performed for the cell groups 150 in each operating region 160. After filtering the charging current I and the voltages measured across the cell groups 150 in an operating region 160, the method 200 performs steps 302-308 as described above with reference to FIG. 8A. Therefore, the description of steps 302-308 is not repeated for brevity.

At 312, For i=1 to N (N=no. of cell groups 150), the method 200 computes a distance metric $D_i$ using the following equation: $D_i[t]=\{R_i[t]-\text{mean}(R[t])\}/\sigma(R[t])$, where $R[t]=\{R_1[t], R_2[t], \ldots, R_p[t]\}$ and $D(t)=\{D_1[t], D_2[t], \ldots, D_p[t]\}$; where p=N (no. of cell groups in a battery pack), or p=m≤N (no. of cell groups in a module/section); and where mean and σ respectively denote the statistical mean and standard deviation. When calculating distance $D_i[t]$ for cell group i, the mean and σ are computed by excluding $R_i[t]$. The distance $D_i[t]$ denotes the normalized distance of Ri[t] from the calculated mean using the rest of the cell groups. Accordingly, the distance metric D can be evaluated across a battery pack or across cell groups in a module. Specifically, the distance metric D can be evaluated for each cell group based on the distance across the pack (i.e., mean and σ are calculated using all cell groups in the pack). Alternatively, the distance metric D can be evaluated for each cell group based on the distance across the module (i.e., mean and σ are calculated using cell groups within a specific module or section).

At 314, the method 200 determines if a maximum value of the distance metrics observed so far for cell group i, called max($D_i[t]$), is greater than or equal to a predetermined threshold. If max($D_i[t]$) is less than the predetermined threshold, at 316, the method 200 determines that the cell group is normal (i.e., the cells in the cell group have internal resistances within a normal range). If max($D_i[t]$) is greater than or equal to the predetermined threshold, at 318, the method 200 determines that the cell group is abnormal or an outlier (i.e., the cells in the cell group have internal resistances not within a normal range). The determination is based on a presumption that in a faulty battery pack, only a small number of cell groups may exhibit faulty or abnormal behavior, and most of the cell groups are healthy. Accordingly, the internal resistances of the cells across the battery pack would most likely be the same (i.e., within a narrow range) except for a few faulty cell groups, which are detected as outliers as described above, where the distance metric D acts as an indicator to detect faulty cell groups.

Figure 9:
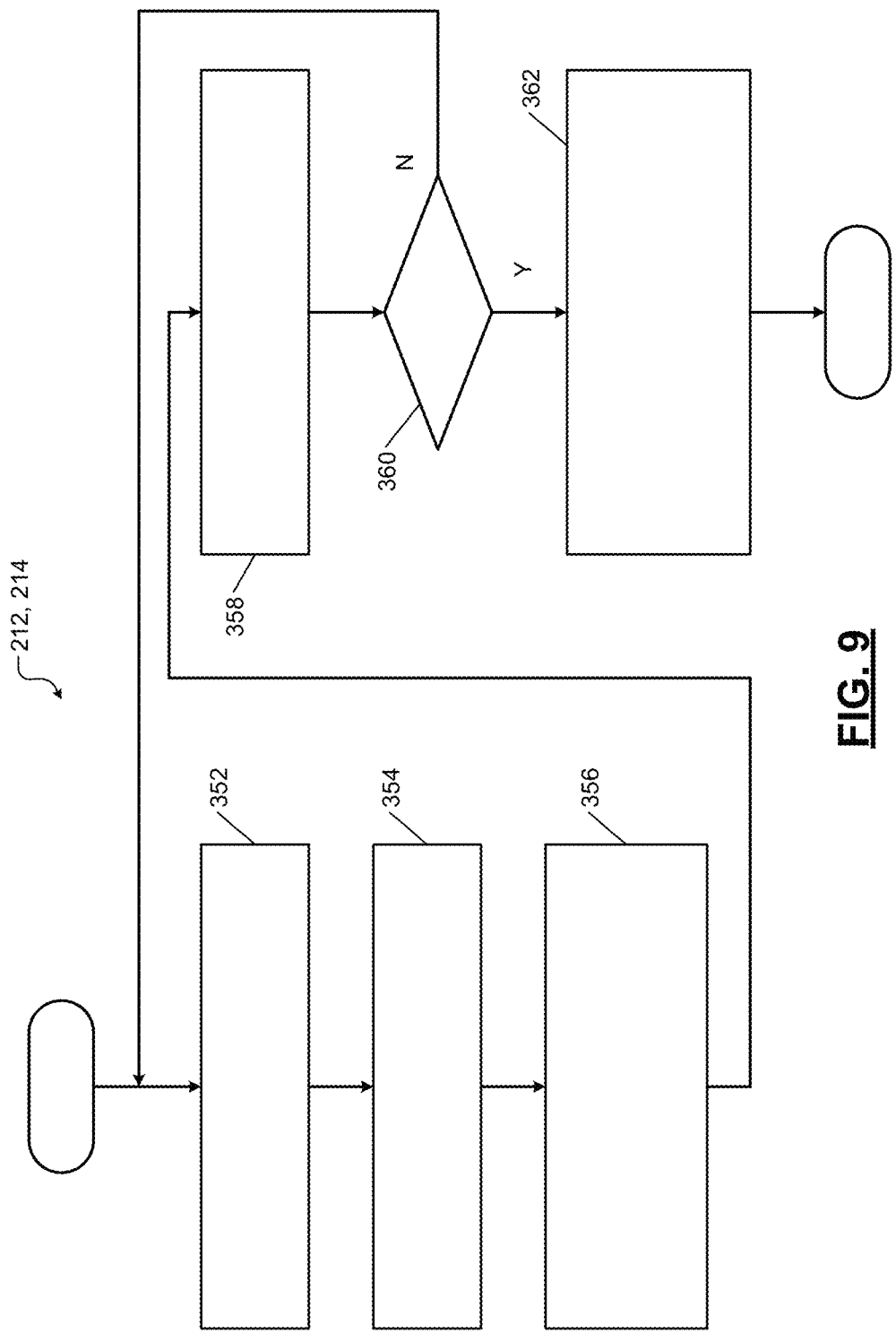

FIG. 9 shows a procedure for selecting optimal data from the summary statistics (i.e., steps 212 and 214 of the method 200 shown in FIG. 6) in further detail. Over a charging cycle, the battery 104 may operate in different operating regions 160 at different times. When the battery 104 is in an operating region 160, the charging current I and the voltages across the cell groups 150 are measured in the operating region 160, and B sets of statistics are computed for the operating region 160. Accordingly, for M operating regions 160, with B bands per operating region 160, the total number of statistics for a charging cycle will be M*B. At the end of the charging cycle only optimal data from these statistics is selected and saved in the memory 148 of the controller 102.

If the battery 104 is healthy (i.e., operating normally with none of the cell groups 150 exhibiting abnormal internal resistances), all of the cell groups 150 will have internal resistances within a narrow range. If the internal resistance of one of the cell groups 150 is deviating from the narrow range, the deviation causes a resistance spread across all of the statistics collected throughout the charging cycle. The resistance spread can be used as a metric to determine which data is optimal that can be further evaluated to isolate an anomalous (i.e., faulty) cell group 150 in the battery 104. The optimal data from these statistics is selected as follows.

At 352, during a charging cycle, the method 200 collects the internal resistance data for the cell groups 150 for each of the M operating regions 160 (defined as shown in FIG. 7). At 354, the method 200 collects the statistics computed for all the cell groups 150 in each band in each of the M operating regions 160 (as described above with reference to FIG. 8A).

At 356, from these M*B statistics, for each band, the method 200 calculates a difference between the maximum and minimum average internal resistances of all the N cell groups 150. The difference between the maximum and minimum average internal resistances of the cell groups 150 is called DeltaR. The method 200 calculates DeltaR using the following equation: DeltaR=$_i^{max}(R_{avg,i})-_i^{min}(R_{avg,i})$, for i=1 to N. The method 200 calculates DeltaR for each of the B bands in each of the operating regions 160 over the charging cycle of the battery 104.

Specifically, in each band, the method 200 computes DeltaR as a difference between the maximum average internal resistance and the minimum average internal resistance of all the cell groups 150. Based on $R_{avg}$ of all the cell groups 150, the method 200 calculates deltaR with maximum and minimum of $R_{avg}$ of all the cell groups 150. This computation is done for all of the operating regions 160. Accordingly, for B=3, the method 200 calculates DeltaR1, DeltaR2, and DeltaR3 for each of the operating regions 160.

At 358, the method 200 selects an optimal band with maximum DeltaR from M*B bands. The band with maximum DeltaR is the band with maximum difference in R across the cell groups 150. At 360, the method 200 determines if the charging cycle is complete. The method 200 returns to 352 if the charging cycle is not complete. If the charging cycle is complete, at 362, the method 200 saves the internal resistance data from the selected band in the memory 148 of the controller 102 at the end of the charging cycle.

The method 200 determines whether to overwrite previously saved band as follows. The method 200 saves (i.e., overwrites) the data of the band with more samples if DeltaR of the band is similar to that of a previously saved band. Alternatively, the method 200 selects the band with a greater DeltaR than that previously saved. That is, the method 200 overwrites data of an old band and saves data of a new band only if DeltaR of the new band is greater than DeltaR of the old band. Essentially, if abs(DeltaR$_{old}$−DeltaR$_{new}$)<a threshold; i.e., if the deltaR difference of the new band is very close to the already saved optimal band, then the method 200 selects the band with greater number of samples to save. If delta_R abs(New−Old)>a threshold, the method 200 saves the band with larger DeltaR.

The data saved in the memory 148 can be used for diagnostics by a service technician and/or for providing an alert to the infotainment subsystem 108. The method 200 can also provide a message about the health of the battery 104 to the infotainment subsystem 108 based on the data saved in the memory 148. The method 200 can also send the data from the selected band to the one or more servers 122 in the cloud for performing prognostics and trending of the health of the battery 104.

Selecting only the optimal data (i.e., the data from the selected band) is helpful since an anomaly in the internal resistance data due to a faulty cell group 150 may not be evident in all the operating regions 160. In general, only a few cell groups 150 may exhibit abnormally high internal resistance and contribute more than other cell groups 150 to the deviation in the internal resistance of the battery 104. Therefore, to isolate only the cell group(s) 150 that contribute(s) most to the deviation in the internal resistance of the battery 104, the above procedure shown and described with reference to FIG. 9 is used to select the optimal internal resistance data from the cell groups 150.

Figure 10:
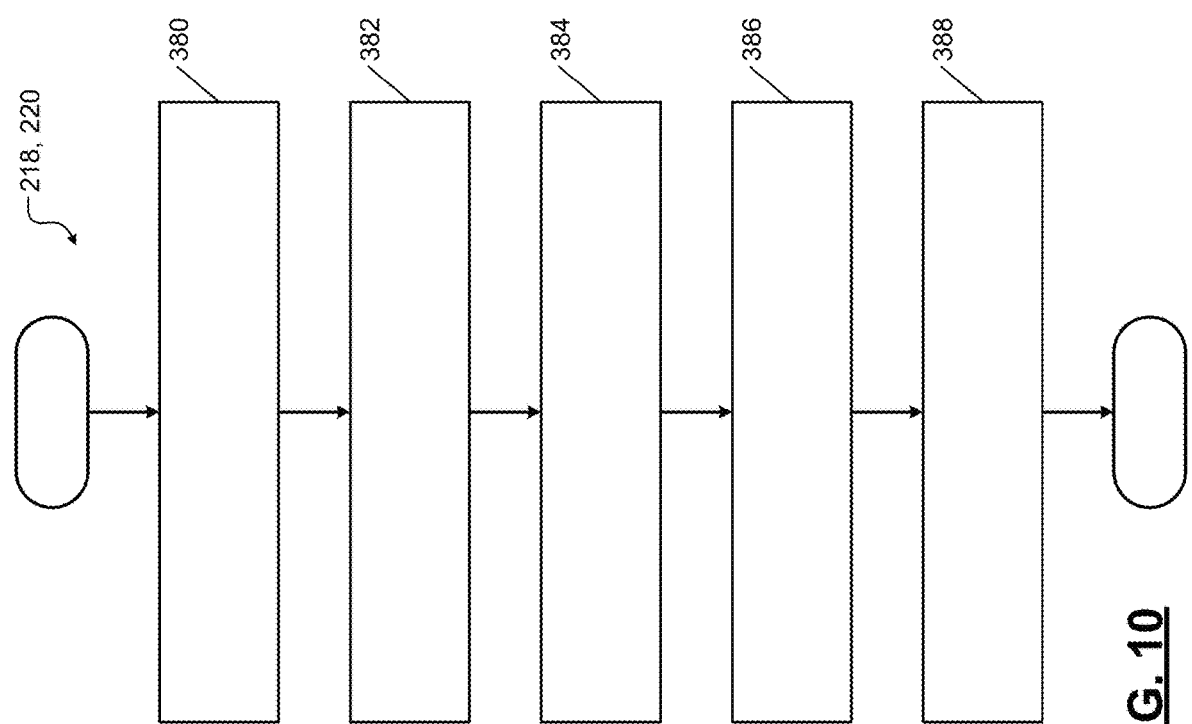

FIG. 10 shows a procedure for detecting failing cell groups in the battery 104 based on the optimal data selected from the summary statistics or the distance metrics, or by using a combination of both the summary statistics and the distance metrics (i.e., steps 218 and 220 of the method 200 shown in FIG. 6) in further detail. At 380, the method 200 obtains the saved statistical data and/or the distance metrics for a plurality of charging cycles, including data from different types of charging methods used. At 382, the method 200 compares the statistical data and/or the distance metrics to respective thresholds calibrated for each type of charging method. At 384, the method 200 generates results of the comparisons (i.e., indications of failing cell groups). For example, the method 200 compares the data from similar charging currents and similar charging methods to detect anomalous behaviors of cell groups.

At 386, the method 200 analyzes the results to determine if some cell groups are failing consistently across all of the charging methods, or in some of the charging methods used to charge the battery 104. At 388, the method 200 identifies the failing cell groups and the charging methods in which the cell groups are failing. This portion of the method 200 can be performed either in the controller 102 onboard the vehicle or in the cloud, and relevant messages can be output via the infotainment subsystem 108 of the vehicle.

Figure 11:
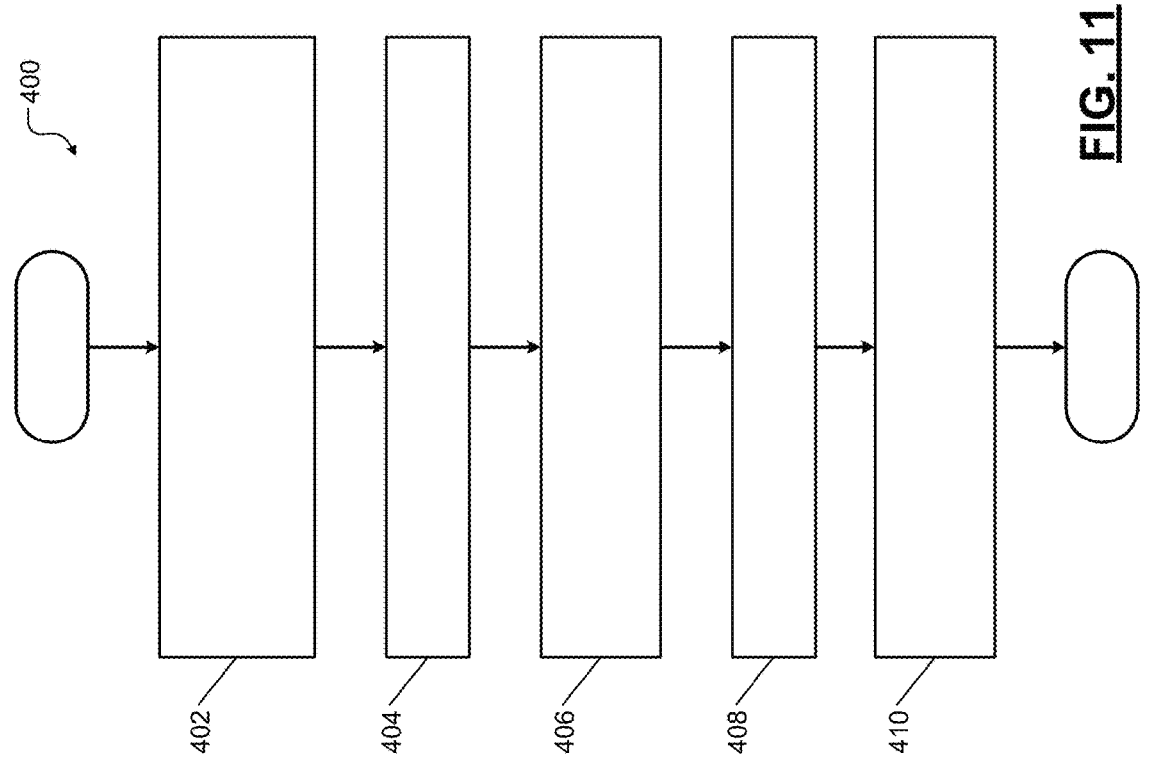

FIG. 11 shows a method 400 of learning from behaviors from a fleet of vehicles to refine the method 200 and calibration of the thresholds used in the method 200. The vehicles in the fleet use the same battery 104 and use the same method 200 in the controller 102 onboard the vehicles. Further, the vehicles may use any of the charging methods (L1, L2, and/or DCFC) to charge the batteries. The method 400 may use the optimal data selected from the summary statistics and/or the distance metrics saved in the controller 102 onboard the vehicles. The method 400 is performed in the cloud.

At 402, the method 400 obtains the optimal data selected from the summary statistics and/or the distance metrics (hereinafter the data) saved in the controller 102 onboard the vehicles over a plurality of charging cycles performed using different charging methods. At 404, the method 400 analyzes the distribution of the data across the fleet (e.g., to detect a trend in the data). Using known failure cases observed in the fleet, the thresholds under different charging methods are calibrated appropriately.

At 406, based on the analysis of the distribution, the method 400 adjusts the logic and/or calibrates the thresholds used by the method 200 to identify failing cell groups in one or more charging methods. The adjustments and/or calibrations may be downloaded to the vehicles. At 408, the method 400 continues to obtain the data from the vehicles and monitor the trends in the distribution of the data. At 410, the method 400 identifies the vehicles in which the trend of the failures persists (i.e., in which the cell groups continue to be identified as being defecting). The method 400 sends notifications to the identified vehicles, the users of which can take schedule service, use a particular charging method or methods in which fewer cell groups are failing, or avoid using a particular charging method or methods in which more cell groups are failing.

Figure 12C:
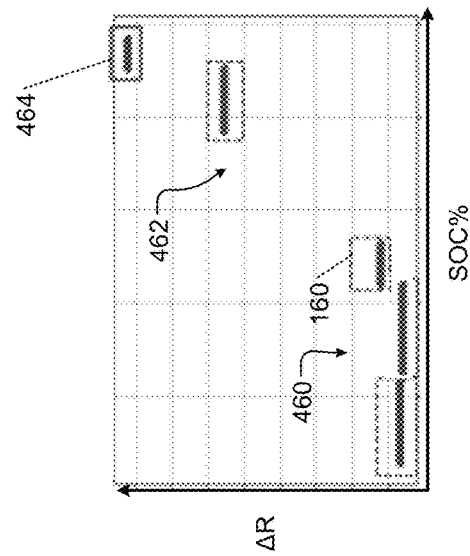
FIGS. 12A-12E show graphs illustrating spreads in internal resistances of the cell groups of the battery.
Figure 12B:
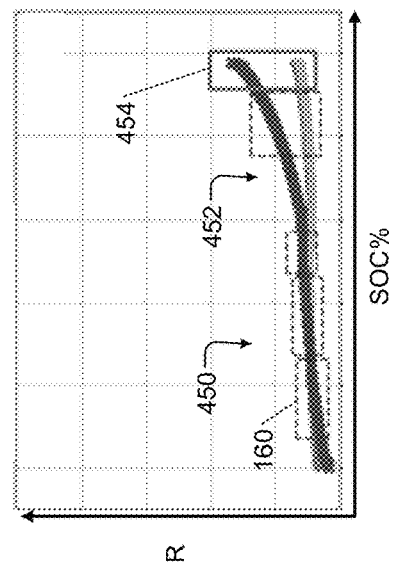
Figure 12A:
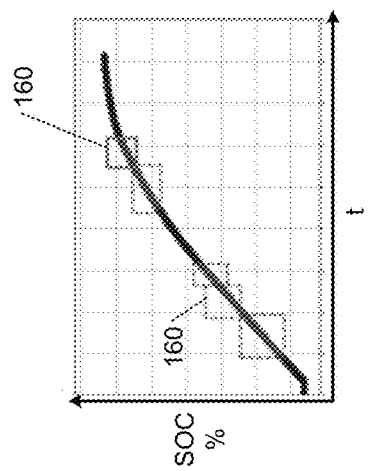

FIGS. 12A-12E show examples of spreads in internal resistances of the cell groups of the battery. FIG. 12A shows a graph of SOC versus time during a charging cycle of the battery 104. FIG. 12B shows a graph of the internal resistance R versus SOC during a charging cycle of the battery 104. The internal resistance data when the cell groups 150 are healthy is shown at 450. The internal resistance data when the cell groups 150 begin to degenerate is shown at 452. The internal resistance data of a cell group that is faulty (i.e., with maximum internal resistance spread) is shown at 454 and is saved in the controller 102.

FIG. 12C shows a graph of DeltaR versus SOC during a charging cycle of the battery 104, where DeltaR is the difference or spread between the maximum and minimum average values of the internal resistance R of all the cell groups 150. The data when the cell groups 150 are healthy is shown at 460. The data when the cell groups 150 begin to degenerate is shown at 462. The data of a cell group that is faulty (i.e., the maximum DeltaR) is shown at 464 and is saved in the controller 102.

Figure 12E:
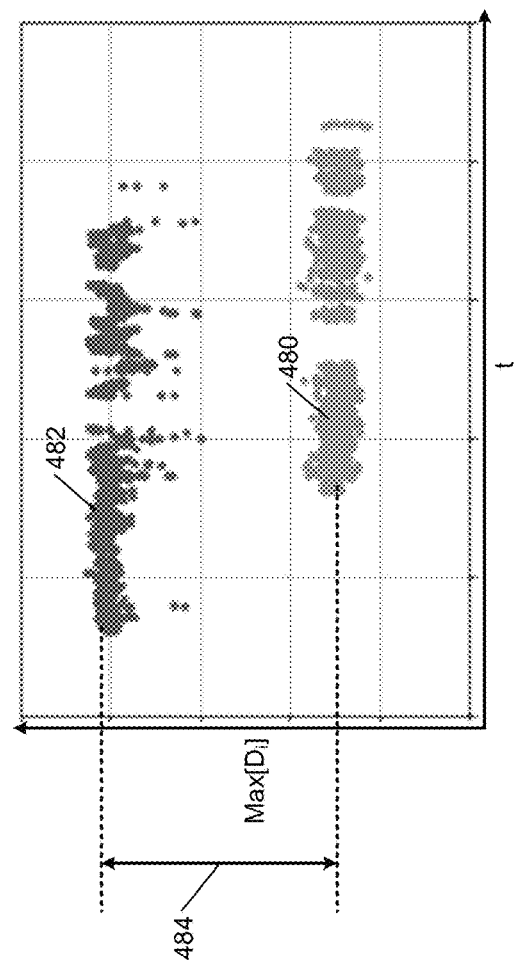
Figure 12D:
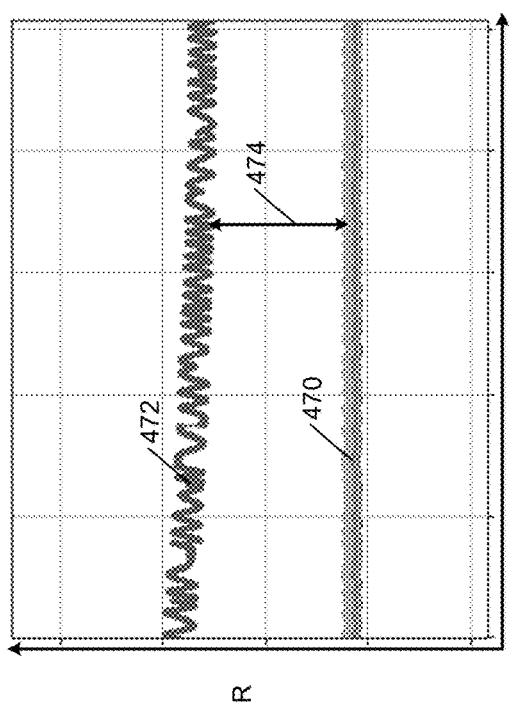

FIG. 12D shows a graph of the internal resistance R versus time during a charging cycle of the battery 104. The data of the healthy cell groups is shown at 470. The data of a faulty cell group is shown at 472. The distance between the data of the healthy cell groups and the data of the faulty cell group is shown at 474. FIG. 12E shows a graph of max[$D_i$] versus time during a charging cycle of the battery 104. The data of the healthy cell groups is shown at 480. The data of a faulty cell group is shown at 482. The distance between the data of the healthy cell groups and the data of the faulty cell group is shown at 484.

The system and method of the present disclosure improves the battery technology. Specifically, the system and method provide an internal resistance estimator that is robust since the estimation using different operating regions accounts for noise and varying operating conditions of the battery and reliably detects faults in the battery. The estimator optimizes the controller memory by storing only optimal health indicator data in the controller memory. The system and method passively identify faults in battery packs and individual cell groups in the battery while the vehicle is being charged regardless of the charging method used. Further, the system and method identify faulty battery packs and cell groups in the battery proactively; that is, before a fault occurs and the vehicle stalls stranding the occupant. The system and method provide early fault indication and prognosis capability for predicting battery performance degradation while managing vehicle operation. The system and method monitor progressive trends in battery health and provide early warning (proactive alerts) to users ahead of a battery failure.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for monitoring a battery of a vehicle, the system comprising:
  a current measuring circuit configured to measure a charging current of the battery comprising a plurality of cell groups connected to each other while the battery is being charged using one of a plurality of charging systems;
  a voltage measuring circuit configured to measure voltages of the cell groups while the battery is being charged using the one of the plurality of charging systems; and
  a controller in communication with current and voltage measuring circuits and configured to:
    define a plurality operating regions in a charging current profile of the battery during a charging cycle of the vehicle while the battery is being charged using the one of the plurality of charging systems;
    filter the charging current and the voltages measured in the operating regions;
    calculate internal resistances of the cell groups in the operating regions based on the filtered current and voltages;
    generate statistical values and distance metrics based on the internal resistances of the cell groups, wherein the distance metrics are generated by dividing differences between the internal resistances and mean values of the internal resistances by a standard deviation of the internal resistances; and
    determine whether one or more of the cell groups is faulty based on the statistical values and the distance metrics irrespective of the plurality of charging systems used to charge the battery, wherein each of the charging systems comprises a different circuit used to charge the battery.

2. The system of claim 1 wherein the controller is configured to determine whether the one or more of the cell groups is faulty based on (i) a highest value of differences between maximum and minimum values of one or more of the statistical values across the cell groups and (ii) a highest value of the distance metrics across the cell groups.

3. The system of claim 1 wherein the controller is configured to determine whether the one or more of the cell groups is faulty based on the statistical values and the distance metrics computed for each of the plurality of charging systems used to charge the battery.

4. The system of claim 1 wherein the controller is configured to define one of the operating regions based on the charging current, temperature, and state of charge of the battery when the charging current is stable for a predetermined time period in the one of the operating regions.

5. The system of claim 1 wherein the controller is configured to:
 define the operating regions based on predetermined ranges of the charging current, temperature, and state of charge of the battery; and
 determine whether the one or more of the cell groups is faulty regardless of changes in temperature and state of charge of the battery.

6. The system of claim 1 wherein the controller is configured to:
 define a plurality of bands within one of the operating regions based on a predetermined range of the charging current and a plurality of predetermined ranges of temperature and state of charge of the battery;
 calculate the internal resistances of the cell groups in the bands based on the filtered current and the voltages;
 generate individual statistical values for the bands based on the internal resistances of the cell groups in the bands;
 determine differences between maximum and minimum values of one or more of the individual statistical values;
 select internal resistance data of the cell groups from one of the bands corresponding to a highest value of the differences between the maximum and minimum values of the one or more of the individual statistical values; and
 diagnose the health of the battery based on the selected internal resistance data.

7. The system of claim 1 wherein the controller is configured to:
 select internal resistance data of the cell groups from one of the operating regions corresponding to a highest value of differences between maximum and minimum values of one or more of the statistical values across the cell groups;
 store information including the selected internal resistance data and a highest value of the distance metrics across the cell groups for diagnosing the one or more of the cell groups;
 send the stored information to a server for prognostics and determining a trend in a health of the battery; and
 provide a message regarding the health of the battery based on the stored information.

8. The system of claim 1 wherein the controller is configured to, for each of the plurality of charging systems used to charge the battery:
 select internal resistance data of the cell groups from one of the operating regions corresponding to a highest value of differences between maximum and minimum values of one or more of the statistical values across the cell groups;
 store the selected internal resistance data and a highest value of the distance metrics;
 compare the selected internal resistance data and the highest value of the distance metrics to respective thresholds calibrated for the plurality of charging systems; and
 determine whether one or more of the cell groups are failing across the plurality of charging systems.

9. The system of claim 8 further comprising a server configured to:
 receive the selected internal resistance data and a highest value of the distance metrics from a plurality of vehicles;
 analyze a distribution of the selected internal resistance data and the highest value of the distance metrics; and
 calibrate the thresholds based on the analysis.

10. The system of claim 9 wherein the server is further configured to:
 monitor trends in the distribution;
 identify one or more vehicles in which one or more cell groups continue to fail; and
 send notifications to the identified vehicles.

11. A method for monitoring a battery of a vehicle, the method comprising:
 measuring a charging current of the battery comprising a plurality of cell groups connected to each other while the battery is being charged using one of a plurality of charging systems;
 measuring voltages of the cell groups while the battery is being charged using the one of the plurality of charging systems;
 defining a plurality operating regions in a charging current profile of the battery during a charging cycle of the vehicle while the battery is being charged using the one of the plurality of charging systems;
 filtering the charging current and the voltages measured in the operating regions;
 calculating internal resistances of the cell groups in the operating regions based on the filtered current and voltages;
 generating statistical values and distance metrics based on the internal resistances of the cell groups, wherein the distance metrics are generated by dividing differences between the internal resistances and mean values of the internal resistances by a standard deviation of the internal resistances; and
 determining whether one or more of the cell groups is faulty based on the statistical values and the distance metrics irrespective of the plurality of charging systems used to charge the battery, wherein each of the charging systems comprises a different circuit used to charge the battery.

12. The method of claim 11 further comprising determining whether the one or more of the cell groups is faulty based on (i) a highest value of differences between maximum and minimum values of one or more of the statistical values across the cell groups and (ii) a highest value of the distance metrics across the cell groups.

13. The method of claim 11 further comprising determining whether the one or more of the cell groups is faulty based on the statistical values and the distance metrics computed for each of the plurality of charging systems used to charge the battery.

14. The method of claim 11 further comprising defining one of the operating regions based on the charging current, temperature, and state of charge of the battery when the charging current is stable for a predetermined time period in the one of the operating regions.

15. The method of claim 11 further comprising:
 defining the operating regions based on predetermined ranges of the charging current, temperature, and state of charge of the battery; and
 determining whether the one or more of the cell groups is faulty regardless of changes in temperature and state of charge of the battery.

16. The method of claim 11 further comprising:
 defining a plurality of bands within one of the operating regions based on a predetermined range of the charging current and a plurality of predetermined ranges of temperature and state of charge of the battery;
 calculating the internal resistances of the cell groups in the bands based on the filtered current and the voltages;

generating individual statistical values for the bands based on the internal resistances of the cell groups in the bands;

determining differences between maximum and minimum values of one or more of the individual statistical values;

selecting internal resistance data of the cell groups from one of the bands corresponding to a highest value of the differences between maximum and minimum values; and diagnosing the health of the battery based on the selected internal resistance data.

17. The method of claim 11 further comprising:

selecting internal resistance data of the cell groups from one of the operating regions corresponding to a highest value of differences between maximum and minimum values of one or more of the statistical values across the cell groups;

storing information including the selected internal resistance data and a highest value of the distance metrics across the cell groups for diagnosing the one or more of the cell groups;

sending the stored information to a server for prognostics and determining a trend in a health of the battery; and providing a message regarding the health of the battery based on the stored information.

18. The method of claim 11 further comprising, for each of the plurality of charging systems used to charge the battery:

selecting internal resistance data of the cell groups from one of the operating regions corresponding to a highest value of differences between maximum and minimum values of one or more of the statistical values across the cell groups;

storing the selected internal resistance data and a highest value of the distance metrics;

comparing the selected internal resistance data and the highest value of the distance metrics to respective thresholds calibrated for the plurality of charging systems; and determining whether one or more of the cell groups are failing across the plurality of charging systems.

19. The method of claim 18 further comprising, at a server:

receiving the selected internal resistance data and a highest value of the distance metrics from a plurality of vehicles;

analyzing a distribution of the selected internal resistance data and the highest value of the distance metrics; and calibrating the thresholds based on the analysis.

20. The method of claim 19 further comprising, at the server:

monitoring trends in the distribution;

identifying one or more vehicles in which one or more cell groups continue to fail; and sending notifications to the identified vehicles.

* * * * *